United States Patent [19]

Yoder

[11] 4,391,651
[45] Jul. 5, 1983

[54] METHOD OF FORMING A HYPERABRUPT INTERFACE IN A GaAs SUBSTRATE

[75] Inventor: Max N. Yoder, Falls Church, Va.

[73] Assignee: The United States of America as represented by the Secretary of the Navy, Washington, D.C.

[21] Appl. No.: 311,709

[22] Filed: Oct. 15, 1981

[51] Int. Cl.³ ............... H01L 21/263; H01L 21/26; H01L 21/203

[52] U.S. Cl. ................... 148/1.5; 29/571; 29/576 B; 148/187; 357/61; 357/91

[58] Field of Search ............ 148/1.8, 187, 175; 29/571, 576 B; 357/91, 61

[56] References Cited

U.S. PATENT DOCUMENTS

| 3,533,857 | 10/1970 | Mayer et al. | 148/1.5 |
|---|---|---|---|
| 3,615,875 | 10/1971 | Morita | 148/1.5 |
| 3,638,300 | 2/1972 | Foxhall et al. | 148/1.5 |
| 3,725,136 | 4/1973 | Morgan | 148/1.5 |
| 3,726,719 | 4/1973 | Brack et al. | 148/1.5 |
| 3,736,192 | 5/1973 | Tokuyama et al. | 148/1.5 |
| 3,756,862 | 9/1973 | Ahn et al. | 148/1.5 |
| 3,796,929 | 3/1974 | Nicholas et al. | 317/235 R |
| 3,824,133 | 7/1974 | D'Asaro et al. | 148/1.5 |
| 3,830,668 | 8/1974 | Dearnaley et al. | 148/1.5 |
| 3,865,633 | 2/1975 | Shannon | 148/1.5 |
| 3,897,273 | 7/1975 | Marsh | 148/1.5 |
| 3,926,682 | 12/1975 | Shinada et al. | 148/1.5 |
| 3,929,512 | 12/1975 | Nicholas et al. | 148/1.5 |
| 3,969,744 | 7/1976 | Nicholas et al. | 357/22 |
| 4,045,251 | 8/1977 | Graul et al. | 148/1.5 |
| 4,058,413 | 11/1977 | Welch et al. | 148/1.5 |
| 4,063,967 | 12/1977 | Graul et al. | 148/1.5 |
| 4,106,953 | 8/1978 | Onodera | 148/1.5 |
| 4,116,717 | 9/1978 | Rahilly | 148/1.5 |
| 4,128,439 | 12/1978 | Jambotkar et al. | 148/1.5 |
| 4,133,701 | 1/1979 | Greenstein et al. | 148/1.5 |
| 4,133,704 | 1/1979 | McIver et al. | 148/1.5 |
| 4,163,984 | 8/1979 | Pucel | 357/22 |
| 4,169,740 | 10/1979 | Kalbitzer et al. | 148/1.5 |
| 4,216,030 | 8/1980 | Graul et al. | 148/1.5 |
| 4,226,648 | 10/1980 | Goodwin et al. | 148/175 |
| 4,290,825 | 9/1981 | Dearnaley et al. | 148/33.4 |

OTHER PUBLICATIONS

Donnelly et al., Solid St. Electronics, 20 (1977), 273.
Yagita et al., J. Appl. Phys., 53 (1982), 1218.

Primary Examiner—Upendra Roy
Attorney, Agent, or Firm—R. F. Beers; P. Schneider; J. G. Wynn

[57] ABSTRACT

A method of fabricating improved semiconductor devices, such as FET's, which require or are improved by a hyperabrupt interface between the active channel and the underlying insulating region. A substrate, such as GaAs, is polished and then implanted with light ions, such as protons, to amorphize the crystal structure down to a certain depth determined by the ion-beam accelerating voltage and the ion fluence level. The crystal is damaged but not amorphized below the lowest amorphization depth. The interface between the amorphized and the non-amorphized, but damaged, regions is a relatively narrow region which will become a hyperabrupt junction. The substrate is then implanted with donor ions, such as Si, in accordance with the requirements of the device to be fabricated and under conditions which provide a retrograde donor ion concentration profile with depth. An annealing/donor activating step is now performed at a relatively low temperature (600° C. or less) to avoid breaking down the hyperabrupt interface.

6 Claims, 1 Drawing Figure

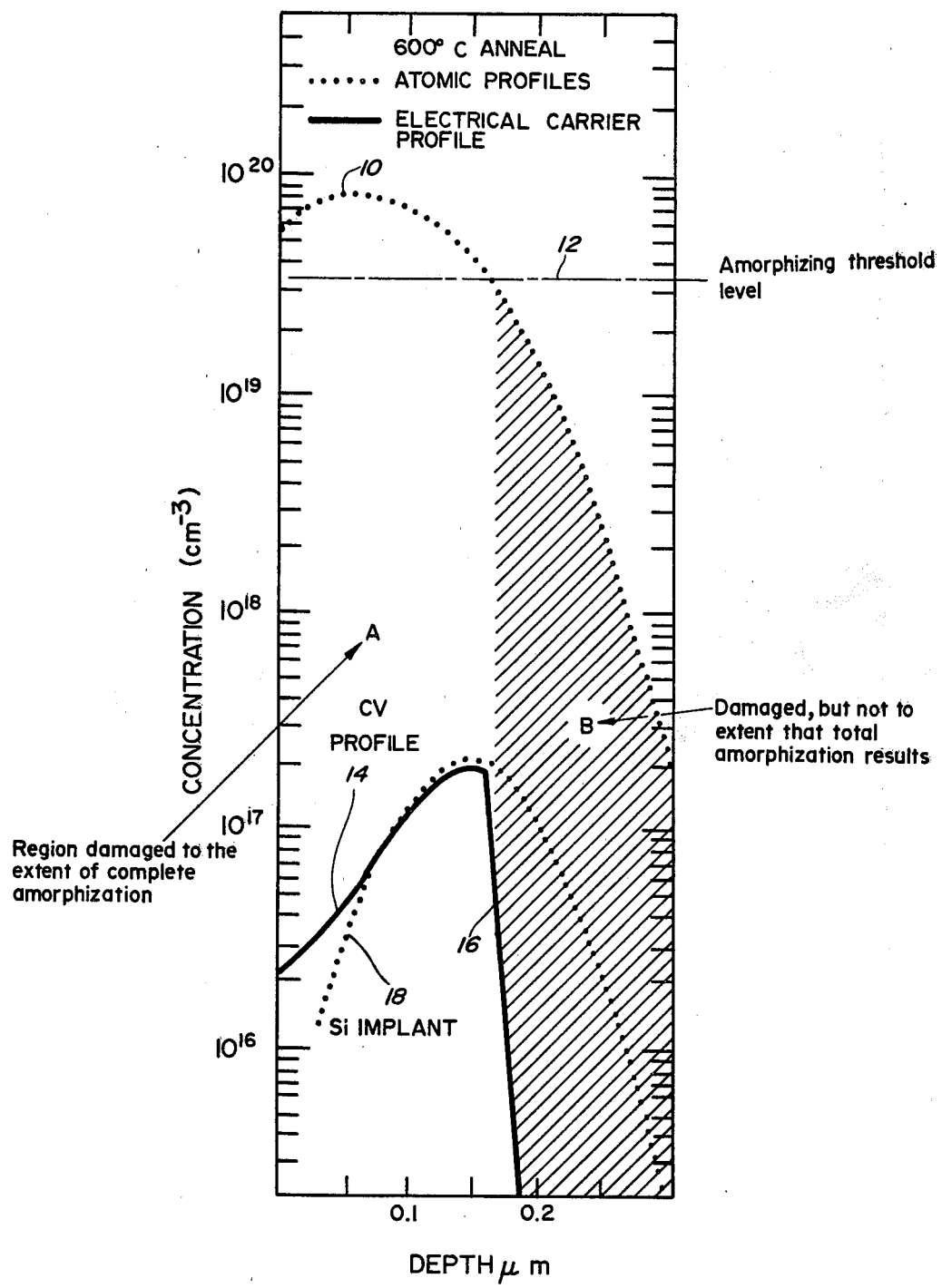

METHOD OF FORMING A HYPERABRUPT INTERFACE IN A GaAs SUBSTRATE

BACKGROUND OF THE INVENTION

This invention relates to the fabrication of improved semiconductor devices and especially to improved FET devices.

It has been found that a retrograde or gradient channel carrier concentration (with respect to depth of the concentration) improves the linearity and noise figures of GaAs transistors. Furthermore, the gain of such transistors is greatly improved by the existence of a hyperabrupt interface between the active and the underlying layers. However, the achievement of these conditions requires expensive fabrication techniques such as molecular beam epitaxy. This invention provides for achievement of these conditions by easy, inexpensive ion-implantation techniques.

SUMMARY OF THE INVENTION

An object of this invention is to create a hyperabrupt interface between the electrically active and the underlying layer of a semiconductor substrate by a relatively inexpensive procedure, and at the same time create a retrograde carrier-concentration profile from the interface to the surface.

This and other objects of the invention are accomplished by utilizing preamorphization of the crystal substrate to provide a retrograde charge-carrier concentration in the active channel and a hyperabrupt interface between the active channel and the underlying insulating region. Preamorphization also permits the use of relatively low annealing temperatures so that the hyperabrupt interface is maintained through the annealing/donor activating process.

BRIEF DESCRIPTION OF THE DRAWING

The single FIGURE is a set of curves showing atomic concentration versus depth below the surface of a semiconductor substrate, a capacitance-voltage (CV) profile with depth showing the hyperabrupt interface, and Si ion concentration with depth.

DETAILED DESCRIPTION OF THE INVENTION

In fabricating an improved FET in accordance with the principles of the present invention, a semi-insulating GaAs substrate is selected which exhibits a high resistivity, greater than $5 \times 10^7$ ohm-cm, which has been prepared in such a manner that no chromium has been intentionally added, so that it does not have additional compensators and so that total background impurities have been kept low (e.g., $<10^{16}/cm^3$).

The GaAs wafer is now polished (mechanically and chemically) and then implanted with protons, preferably, since these are the lightest ions available. The proton fluence (ions/cm$^2$) and energy (accelerating voltage) used are that which are necessary to amorphize the GaAs crystal to the depth required for the active channel of the type of semiconductor device contemplated. A "fill" implant of protons is required at a lesser energy level to insure that the crystal surface is also amorphized. Ion beam current and duty cycle must be adjusted to prevent self-annealing of the implant damage. The wafer should also be oriented with the ion beam such that any of the major crystallographic axes are tilted 7° from the ion beam so as to preclude channelling.

Other ions may be substituted for protons, e.g., helium ions, noble gas ions, or ions of other elements which are electronically inert in GaAs in accordance with the profiles and mobilities required. Each type of ion used will require a fluence level that is inversely proportional to its mass. Also, each type of ion used will require an accelerating voltage that is directly proportional to its mass. Damage to the crystal structure of the ion-bombarded wafer is proportional to the fluence (ions per unit area multiplied by time) of the ions and to their masses. Since these ions are intended to damage the crystal structure, they may hereinafter be referred to as "damage ions".

The next ion implantation consists of donor ions. These may be Si, Se, a combination of Si and Se ions, or other donor ions or combinations thereof. These are implanted at the standard fluence levels required for the particular device being fabricated. The combined use of Column IV and Column VI donor ions appears to improve the activation efficiency by reducing self- and anti-site defect compensation. The energy (ion-accelerating voltage) of the donor implant or implants should be such that the peak donorion concentration lies at about 90% of the depth of the boundary between the amorphized and the non-amorphized, but damaged, region. This gives a desired retrograde activated donor ion concentration profile with depth, i.e., a donor-ion concentration which decreases in magnitude from the region of the interface between the amorphized and the non-amorphized, but damaged, region to the surface by a factor of approximately two. A shallow "fill" implant of donor ions is to be avoided since this would result in a flat, non-retrograde implant profile of the donor impurity concentration. If selected area N++ implants are required for ohmic contacts, they should be made prior to the following annealing/donor activating step.

The FIGURE shows that the atomic (proton) profile 10, also called the damage implant curve, peaks at a depth of about 0.05 micrometers for the example shown. Damage to the extent of amorphization occurs above a certain concentration level 12. From this level down, the implanted ions damage but do not amorphize the crystal. As previously explained, the amorphizing threshold level 12 will be lower for damage ions more massive than protons. The depth of the armophized/non-amorphized interface may be determined by standard etching procedurs by considering that the amorphized region will etch at a rate more than 10 times faster than the single crystalline region beneath the interface. The damage ion concentration at this interface depth may be determined by standard Secondary Ion Mass Spectrograph (SIMS) techniques and the ion implant fluence and accelerating voltages adjusted/calibrated accordingly. The unshaded area A shows, approximately, the depth range of the crystal which is damaged and amorphized. The shaded area B shows, approximately, the depth range of the crystal which is damaged but not amorphized. The shaded area B also remains an insulating region.

The CV profile 14 shows the number of ions which are electrically active (after annealing) and their depths in the crystal. The straight line at the right side thereof indicates a hyperabrupt interface 16 between the electrically active and the insulating regions of the crystal. The atomic profile 18 shows the donor chemical (in this case Si) atom concentration versus depth from the crystal surface.

The curves are generalized distribution curves for a given set of fluence and accelerating voltage values. Different sets of values will give different curves of the same general forms. It is to be noted that the CV profile 14 (electrically activated charge-carrier impurity concentration versus depth) differs markedly from the standard LSS (Lindhard - Scharff - Schiott) atomic profile such as the atom profile 18 of the FIGURE for example. A "fill" implant of protons may be effected at a lesser energy to insure that the crystal surface is also amorphized.

The next step is annealing the wafer to activate the donors and restore the crystallinity of the surface. Since the amorphous region reorders at much lower temperatures than the damaged, but still crystalline, region, this annealing/donor activating step can be accomplished at much lower temperatures than would otherwise be required. This is fortunate since to retain the hyperabrupt nature of the interface, the annealing temperature should not exceed 600° C. Thermal annealing time of 45-60 minutes at 580° C. should suffice to activate/recrystallize. Reorder/activation by electron beam annealing techniques should be such that electron penetration depth does not exceed that of the depth of the active channel. For thermal annealing, any of the conventional processes is applicable although capless annealing in OH-free flowing arsine is preferred. If laser annealing is used, the scanning C.W. technique is preferred.

After the anneal step, the semiconductor device is fabricated in any conventional manner.

The above procedure leaves a region beneath the active region which retains damaged but highly insulating (e.g., $>10^8$ ohm-cm) GaAs. This region of damage retains charge-carrier traps but, because of the nature of the region, these traps cannot ionize and refill with time contants commensurate with the microwave frequency operation of the device. Thus, the underlying traps are of no real significance unless low-frequency operation is contemplated.

The present techniques permit device processing at temperatures considerably lower than by conventional vapor-phase epitaxy, liquid-phase epitaxy, or prior ion-implant technology. Preamorphization of the device's active layer region permits this low-temperature processing which is so necessary to preclude unwanted diffusion of impurities.

The described fabrication technique is compatible with fabrication techniques for monolithic, integrated, and/or discrete devices or circuit structures. The hyperabrupt technique is also applicable to the fabrication of other GaAs devices requiring hyperabrupt interfaces such as IMPATT diodes and transferred electron devices. It applies generally to the III-V element transistor.

The technique can be used to advantage in the fabrication of semiconducting devices, such as InP, where improved control of the impurity profile is required.

An important advantage of the present technique is the ability to simultaneously create:
(a) a hyperabrupt interface between the active channel and underlying substrate without resorting to expensive fabrication procedures, such as molecular beam epitaxy; and (b) a retrograde channel ion concentration for improved device linearity.

Further advantages are the higher activation efficiencies of channel implants and the ability to achieve ohmic contact implants with a low-temperature anneal.

Obviously, many modifications and variations of the present invention are possible in light of the above teachings. It is therefore to be understood that, within the scope of the appended claims, the invention can be practiced otherwise than as specifically described and still be within the spirit and scope of the appended claims.

What is claimed is:

1. An improved method of forming, in the fabrication of a desired FET, a hyperabrupt interface in a GaAs substrate, wherein said improved method comprises the steps of:
   preamorphizing a region of said GaAs substrate to a predetermined depth;
   implanting donor ions in said preamorphized region to a depth of 90% of the predetermined depth thereby creating a retrograde donor ion concentration profile with depth; and
   annealing said GaAs substrate to activate said implanted donor ions, thereby creating an electrically active region and an underlying amorphous region in said preamorphized region and forming said hyperabrupt interface therebetween.

2. The improved method of claim 1 wherein said preamorphizing step comprises the steps of:
   polishing said GaAs substrate;
   implanting damage ions at a fluence and an energy level necessary to preamorphize said polished GaAs substrate to the predetermined depth, the predetermined depth being that which is required for the active channel of the desired FET; and
   implanting fill damage ions at a lesser energy level to insure that the surface of said polished GaAs substrate is also preamorphized.

3. The improved method of claim 2 wherein said damage ions are protons.

4. The improved method of claim 3 wherein said damage ions are produced from one or more elements selected from the group consisting of helium, hydrogen, and the noble gases.

5. The improved method of claim 4 wherein said donor ions are produced from one or more elements selected from the group consisting of Si and Se.

6. The improved method of claim 5 wherein said annealing step is performed at a temperature of 600° C. or less to restore crystallinity in the electrically active region, but yet avoid breaking down said hyperabrupt interface.

* * * * *